United States Patent [19]

Ernst et al.

[11] Patent Number: 5,052,030
[45] Date of Patent: Sep. 24, 1991

[54] METHOD FOR SYNCHRONIZING A CLOCK, GENERATED WITH THE ASSISTANCE OF A COUNTER, TO A REFERENCE CLOCK

[75] Inventors: Wolfram Ernst; Gerhard Uhlig, both of Munich, Fed. Rep. of Germany

[73] Assignee: Siemens Aktiengesellschaft, Munich, Fed. Rep. of Germany

[21] Appl. No.: 502,931

[22] Filed: Apr. 2, 1990

[30] Foreign Application Priority Data

May 31, 1989 [DE] Fed. Rep. of Germany ....... 3917712

[51] Int. Cl.$^5$ ............................................ H03K 5/135
[52] U.S. Cl. ...................................... 375/108; 331/2; 331/49; 328/120; 375/119
[58] Field of Search ............... 328/120, 134; 331/1 A, 331/2, 18, 49; 371/57.1, 65; 375/95, 108, 118, 119

[56] References Cited

U.S. PATENT DOCUMENTS 4,282,493  8/1981  Moreau .................................. 331/49
4,297,649 10/1981  Sbuelz .................................. 331/49
4,583,054  4/1986  Basile .................................. 331/49

Primary Examiner—Benedict V. Safourek
Attorney, Agent, or Firm—Hill, Van Santen, Steadman & Simpson

[57] ABSTRACT

In order to replace a reference clock $s_R$, as needed, and without phase shift, with another clock f, the latter clock must be synchronized to the reference clock in frequency and in phase. Since the reference clock can fail or can be disturbed, undesirable synchronizations often occur in such cases. An error-free, phase-wise optimal synchronization of the two clocks is achieved and synchronization is carried out as a rule only when a defined edge of the reference clock appears within a time range defined with reference to the clock f.

5 Claims, 2 Drawing Sheets

METHOD FOR SYNCHRONIZING A CLOCK, GENERATED WITH THE ASSISTANCE OF A COUNTER, TO A REFERENCE CLOCK

BACKGROUND OF THE INVENTION

1. Field of the Invention

The present invention relates to a method for synchronizing a clock, generated with the assistance of a counter, to a reference clock that is supplied via a reference line.

2. Description of the Prior Art

FIG. 1 illustrates a specific application of a synchronization circuit SYN in a central clock supply of a telecommunications switching center that is synchronized by an external reference frequency $f_E$ according to the master/slave principle. The central clock supply is composed of a first, central clock generator CCG1 and of a second, central clock generator CCG2, whereby, in normal operation of the central clock supply, the first, central clock generator CCG1 generates a first clock $f_1$ from the external reference clock $f_E$ via a first phase-locked loop PLL1 and via a first counter C1, this first clock $f_1$ being through-connected by way of a switch s1a to the output of a clock supply and synchronizing the switching center as the exchange clock.

While this is occurring, the second, central clock generator CCG2 forms a second clock $f_2$ of the same frequency via a second phase-locked loop PLL2 and via a second counter C2, the second clock $f_2$, however, being through-connected to the output of the central clock supply as an exchange clock by way of a second switch s2a only in a backup sense (given outage of the first, central clock generator or for routine test purposes). When, therefore, the switch s1a is closed, then the switch s2a is opened and vice-versa. A switch s1p and a switch s2p have the same relationship to one another. During normal operation of the central clock supply, the switch s2p is closed and the switch s1p is opened, whereas the switch s2p is opened and the switch s1p is closed in the backup case given a change of the normallyactive, first central clock generator.

Since, in the backup case, the first clock $f_1$ is replaced by the second clock $f_2$ as the exchange clock, it is necessary in order to avoid the phase skip that the second clock also coincides with the first clock, that represents the reference clock here, with respect to the phase relation at all times.

It is known to meet the requirement with the assistance of a synchronization circuit SYN that, for example, registers each trailing edge of the reference clock and that resets a counter with the respective, following leading edge of a counting clock, as a result whereof the clock generated by this counter is constantly synchronized to the reference clock. Supplying the synchronization circuit with the reference clock thereby occurs via a reference line $L_R$.

When pulses can arise given a sudden outage of the reference clock or due to undesired over-couplings onto the reference line appear on the reference line, for example, then the trailing edges thereof likewise lead to a synchronization and, in the specific example of FIG. 1, effect a lasting, irreversible phase skip of the exchange clock given a subsequent change of the active, central clock generator.

SUMMARY OF THE INVENTION

The object of the present invention, therefore, is to guarantee a faultless synchronization of a clock to a reference clock.

In a method of the type set forth above, this object is achieved, according to the present invention, in a method for synchronizing a clock (f) generated with the assistance of a counter (c) to a reference clock ($f_R$) that is supplied via a reference line ($L_R$), and is particularly characterized in that:

(a) a defined edge of the reference clock that appears within a time range determined with respect to the clock (f) leads directly to the synchronization of the clock to the reference clock;

(b) the defined edges of the reference clock that lie outside of the time range do not lead to a synchronization until they have appeared in sufficient number after an executed synchronization; and (c) pulses nonetheless appearing on the reference line given outage of the reference clock having such defined edges that lie outside of the time range do not lead to a synchronization under any circumstance.

What is therefore achieved that only those edges of the reference clock that lie within a prescribed, short time interval usually lead to the synchronization of the clock.

An arrangement for implementing the method is particularly characterized in that (a) a first device is present with which a time window (ZF) having a defined position and size is determined in the form of a window signal (CEP) with respect to the clock (f);

(b) a second device is present with which a synchronization of the clock is effected when a defined edge of the reference clock lies within the time interval defined by the window signal (CEP);

(c) a second counter (C2) is present that (c1) counts each of the defined edges of the reference clock that lie outside of the time interval;

(c2) is again loaded with a defined value at each synchronization, and (c3) generates a carry signal (CI) when it reaches its highest reading, the carry signal leading to the triggering of the synchronization outside of the time interval; and (d) a third device is present with which an unallowed synchronization of the clock is prevented when the reference clock fails to appear.

In conformity with a particular development and feature of the arrangement of the invention, the arrangement is particularly characterized in that:

(a) the reference clock acts on the clock input of a retriggerable monostable circuit (MF); and (b) the output signal of the retriggerable monostable circuit acts on the reset input of the second counter (C2).

According to this feature, the arrangement enables a retriggerable monostable circuit to prevent an unallowed synchronization given outage of the reference clock in a particularly simple manner.

According to another feature of the invention, the time window with respect to the clock is defined by the comparator in what is likewise a particularly simple manner and the arrangement is particularly characterized in that the first device is a comparator (Vg) that compares whether the momentary reading of the counter (C) corresponds to a value that lies within a predetermined value range and thereby forms a window signal at its output that, with reference to the clock (f), generates a time window (ZF) defined by the value range.

According to another feature of the invention, the arrangement serves for a suitable, circuit-oriented version of the requirement that the synchronization bear usually only occur when a defined edge of the reference clock lies within a defined periodically-recurring time interval, and the arrangement is particularly characterized in that the second device is composed of an edge detector (FD) and of a combinational logic system (SN), whereby:

(a) the edge detector generates an enable pulse (CET) of a defined length from a defined edge of the reference clock; and (b) the combinational logic system generates a synchronization pulse (SI) when either the enable pulse (CET) lies in the time window signal or when the enable pulse (CET) lies outside of the counting window and the second counter has reached its highest reading.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
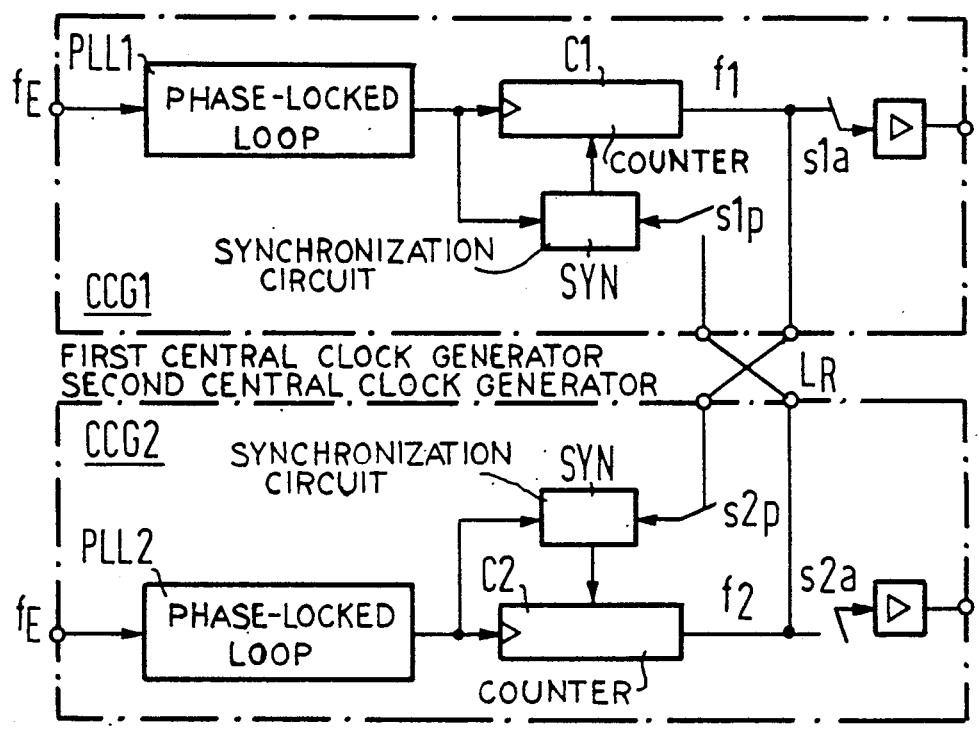
FIG. 1 illustrates a central clock supply of a telecommunications switching center which may employ the present invention.
Figure 3:
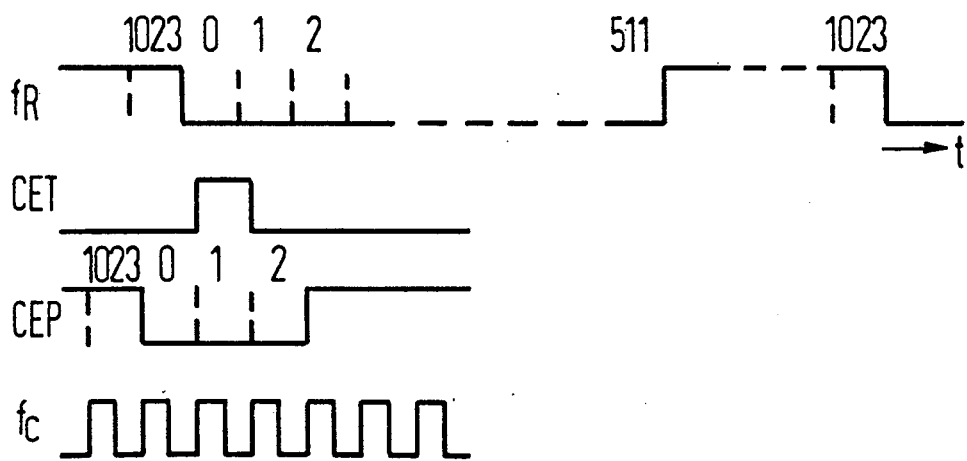
FIG. 3 is a graphic illustration in the form of a timing diagram for explaining the operation of the circuit arrangement of FIG. 2.
Figure 2:
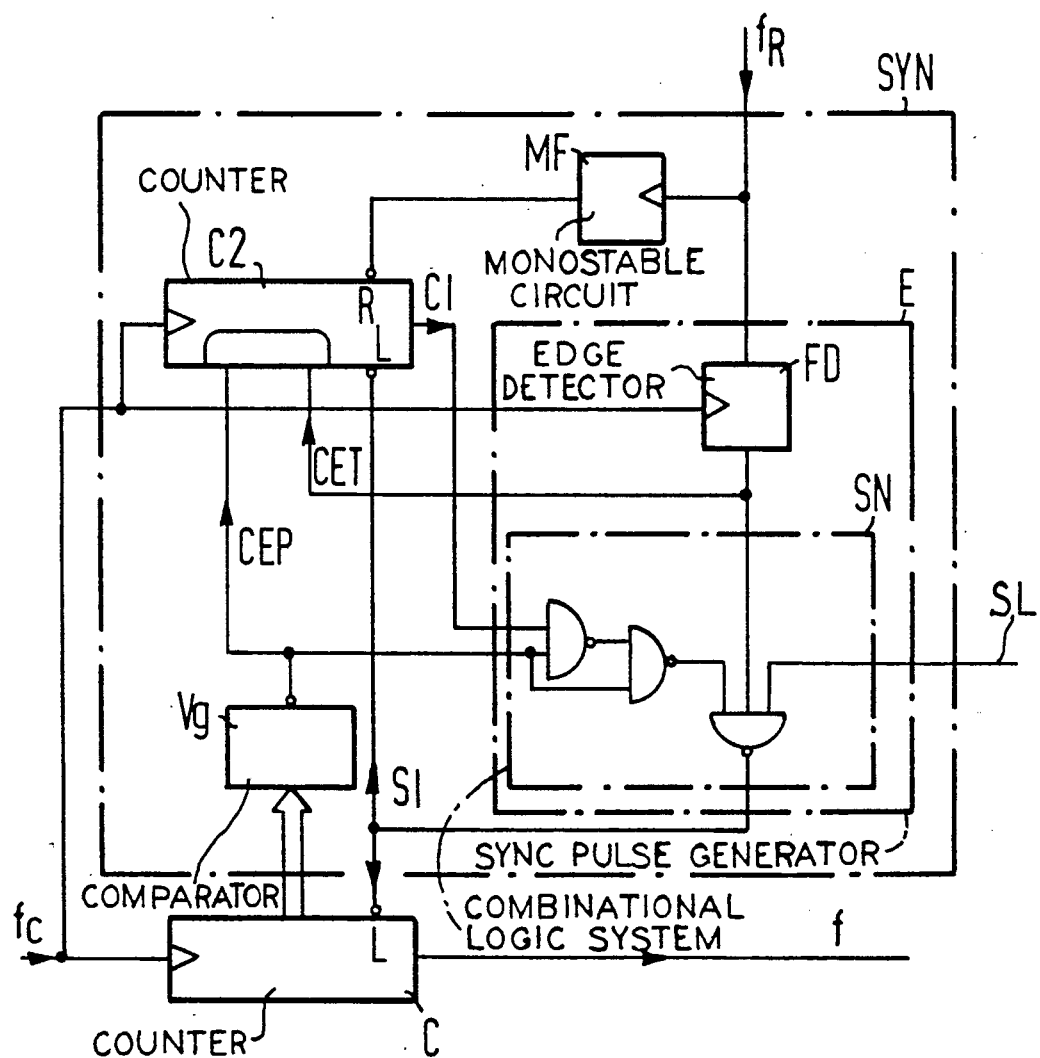
FIG. 2 is a schematic representation of the structure of a circuit arrangement for implementing the method of the invention.

An exemplary embodiment for realizing the method of the invention shall be set forth below in greater detail with reference to FIGS. 2 and 3.

A circuit arrangement SYN for synchronization of a clock f to a reference clock $f_R$ with the assistance of a counter C is composed of a comparator Vg, of a device E, of a second counter C2 and of a retriggerable monostable circuit MF.

The comparator Vg directly receives the reading of the counter C that it compares to the values of its internal value set (0, 1, 2). Its output lies exactly at zero when the reading of the counter C amounts to the values 0, 1 or 2. With its output, it generates a window signal CEP, the window signal CEP generating a time window ZF that is defined by the values 0, 1, 2 with respect to the clock f. The realization of such a time window could also be realized in a somewhat more involved fashion with a synchronous counter in combination with a small logic circuit.

The size of the time window ZF is dependent on the extent to which the clock f normally drifts away from the reference clock in a period 1/f without the synchronization circuit SYN of the present invention, i.e. to what extent the defined edges of the two clocks shift relative to one another.

The device E generates a synchronization pulses SI that, first of all, effects the synchronization of the clock to the reference clock $f_R$ with a reloading L of the second counter C2. The time of the reloading is defined by the leading edge of a counting clock fC.

The device E comprises an edge detector FD and a combinatorial logic in the form of a combinational logic system SN. With the next-following, leading edge of the counting clock $f_c$, the edge detector FD generates a pulse of a counter enable signal CET from each trailing edge of the reference clock, this counter enable signal CET having the period length of the counting clock $f_c$. The output of the combinational logic system that supplies the synchronization pulse lies exactly at a logical "0" when either the counter enable signal CET lies at a logical "1" and the window signal CEP lies at a logical "0" or a carry signal CI that stems from the second counter lies a logical "1" and the window signal CEP lies at a logical "1". The synchronization pulse having the length of a period of the counting clock, in addition to being generated by the carry signal CI, is therefore only generated when the negative edge of the reference clock $f_R$ falls into that time domain that is characterized by counter readings 1023 (highest counter reading), 0, and 1 of the counter C that, therefore, lies chronologically one counting clock before the time window ZF of identical length.

The second counter C2 counts those pulses of the counter enable signal CET that lie outside of the time window ZF defined by the window signal and generates the carry signal CI that leads to the triggering of the synchronization pulse via the combinational logic system SN when it reaches its highest reading count.

What is thereby enabled is that a synchronization can also occur outside the time window ZF by way of exception. This, first of all, is necessary upon initialization of the counter (or, respectively, of the system in which the counter is integrated) and, secondly, is necessary given error-conditioned counter skips.

In both of these case, the pulse formed by the counter enable signal CET will usually be located outside of the time window and synchronization can therefore not occur until after the second counter C2 has counted up.

Individual pulses of the counter enable signal CET that lie outside of the time window ZF therefore do not lead to the triggering of the synchronization pulse SI, whereby a synchronization pulse is triggered after a defined time given a pending pulse of the counter enable signal that lies outside of the time window.

The retriggerable monostable circuit MF has a time constant that is somewhat longer than the period of the reference clock. As a result thereof, its output remains constantly set to a logical "1" given the application of the reference clock. With an outage of the reference clock, it falls back into its stable condition and effects a resetting state to the input R of the second counter C2 after each period of the counting clock $f_c$. This therefore prevents the second counter C2 from gradually reaching its highest count due to negative edges of individual pulses nonetheless appear on the reference line $L_R$ for supplying the reference clock (for example, due to overcoupling), the second counter potentially erroneously effecting a synchronization as a result thereof. The operation of the retriggerable monostable circuit in the specific exemplary embodiment of FIG. 2, of course, can also be implemented in a somewhat involved fashion by a microprocess that is informed of the outage of the reference clock via a monitor. The microprocessor can therefore inhibit the synchronization circuit, for example, with the assistance of a signal SL, given outage of the reference clock, setting it to "0" for this purpose.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method of synchronizing a clock to a reference clock supplied on a reference line, comprising the steps of:
   defining a time window with respect to the clock;
   synchronizing the clock to the reference clock when a defined edge of the reference clock appears within the time window;
   resynchronizing the clock to the reference clock after counting a predetermined number of defined edges which appear outside of the time window; and
   detecting the outage of the reference clock and preventing resynchronization in response to interference pulses on the reference line which have such defined edges outside of the time window.

2. Apparatus for synchronizing a clock to a reference clock supplied on a reference line, comprising:
   first means receiving a clock and responsive thereto to produce a window signal representing a time window of a defined time position and duration with respect to the clock;
   second means connected to said first means and to the reference line and operable to receive the reference clock, the clock and said window signal and synchronize said clock to the reference clock in response to the appearance of a defined edge of the reference clock during the time window;
   counting means connected to said first and second means and operable to count the defined edges of the reference clock which are outside of the time window, said counting means including a presettable counter which is preset to a predetermined counter setting by said second means upon synchronization and which generates a carry signal which is applied to said second means for causing synchronization outside of the time window; and
   third means connected to the reference line and to said counting means and operable to inhibit generation of the carry signal by said counting means when the reference clock fails to appear.

3. The circuit arrangement of claim 2, wherein said third means comprises:
   a retriggerable monostable circuit including a clock input connected to the reference line, and an output connected to said reset input of said counter.

4. The circuit arrangement of claim 3, wherein said first means comprises:
   a comparator connected to said counter for comparing the momentary count opposite the counter to a value lying within a predetermined range and thereby form a window signal that, with reference to the clock, generates the time window defined by the value range.

5. The circuit arrangement of claim 4, wherein:
   said second means comprises an edge detector and a logic system;
   said edge detector including a clock input for receiving the clock, an input connected to the reference line for receiving the reference clock and an output connected to said logic system and operable to produce an enable pulse of a predetermined length in response to a defined edge of the reference clock; and
   said logic system is connected to said first means and to said second means, and is operable to produce a synchronization pulse when either the enable pulse lies within the time window signal or when the enable pulse lies outside of the window and said counter has reached its highest count.

* * * * *